United States Patent
Raja et al.

(10) Patent No.: US 9,483,068 B2
(45) Date of Patent: Nov. 1, 2016

(54) ESTIMATING AND MONITORING THE EFFECTS OF TRANSISTOR AGING

(71) Applicant: NVIDIA CORPORATION, Santa Clara, CA (US)

(72) Inventors: Tezaswi Raja, San Jose, CA (US); Andrew Charnas, San Francisco, CA (US)

(73) Assignee: NVIDIA Corporation, Santa Clara, CA (US)

( * ) Notice: Subject to any disclaimer, the term of this patent is extended or adjusted under 35 U.S.C. 154(b) by 429 days.

(21) Appl. No.: 13/866,969

(22) Filed: Apr. 19, 2013

(65) Prior Publication Data

US 2014/0312873 A1    Oct. 23, 2014

(51) Int. Cl.
*G05F 3/02* (2006.01)
*G01R 31/26* (2014.01)
*H03K 17/14* (2006.01)
*H03K 19/003* (2006.01)

(52) U.S. Cl.
CPC ............. *G05F 3/02* (2013.01); *G01R 31/2642* (2013.01); *H03K 17/145* (2013.01); *H03K 19/00361* (2013.01)

(58) Field of Classification Search
CPC  G01R 31/31703; G05F 3/02; H03G 3/3047; H01L 22/34; H03K 19/00361; H03K 17/145

USPC ................... 324/537, 520, 535, 532, 750.02, 324/750.01, 750.19, 750.3; 327/378, 419, 327/157, 148

See application file for complete search history.

(56) References Cited

U.S. PATENT DOCUMENTS

| | | | |
|---|---|---|---|
| 6,535,013 B2* | 3/2003 | Samaan | 324/750.3 |
| 7,205,854 B2* | 4/2007 | Liu | 331/57 |
| 7,382,165 B2* | 6/2008 | Gonzalez et al. | 327/39 |
| 2006/0223201 A1* | 10/2006 | Liu et al. | 438/10 |
| 2009/0029659 A1* | 1/2009 | Gonzalez | 455/127.1 |
| 2013/0254731 A1* | 9/2013 | Bansal et al. | 716/113 |
| 2014/0240032 A1* | 8/2014 | Guo et al. | 327/513 |

* cited by examiner

*Primary Examiner* — Melissa Koval
*Assistant Examiner* — Rahul Maini
(74) *Attorney, Agent, or Firm* — Artegis Law Group, LLP

(57) ABSTRACT

One embodiment of the present invention sets for a method for monitoring the aging of a circuit. The method includes operating an aging unit included in the circuit beginning at a first time. The method also includes in response to a trigger event, operating a non-aging unit also included in the circuit beginning at a second time wherein the second time is subsequent to the first time. The method further includes detecting a frequency difference between a first frequency generated by the aging unit and a second frequency generated by the non-aging unit. The method also includes generating a modified power supply voltage based on the frequency difference. The method also includes applying the modified power supply voltage to the non-aging unit.

20 Claims, 5 Drawing Sheets

ESTIMATING AND MONITORING THE EFFECTS OF TRANSISTOR AGING

BACKGROUND OF THE INVENTION

1. Field of the Invention

Embodiments of the present invention relate generally to transistor aging and, more specifically, to estimating and monitoring the effects of transistor aging.

2. Description of the Related Art

Circuits that include transistors experience aging effects. Aging causes the performance of transistors in the circuits to degrade. More specifically, the switching speed of the transistor increases when the transistor ages. Adjusting for the effects of aging is typically difficult, as there may be millions of transistors in a circuit. Further, due to the physical size of the transistors, transistors within circuits may be difficult to probe or modify in an attempt to compensate for aging effects.

Some techniques for monitoring and adjusting for the effects of transistor aging have been developed. In one such technique, the overall aging of a circuit during the lifetime of the circuit may be estimated at manufacturing time, or at some other early time, and the different elements of the circuit may be "margined" according to that estimate. When so margined, the circuit is operated using parameters that are based on the characteristics of an aged version of the circuit. For example, a "margined" circuit would always be operated within clock frequency and power supply voltage ranges that are based on the end of life characteristics of the circuit, regardless of whether the circuit is one day old or 3 years old.

However, when a circuit is new, the circuit has the capability to operate within power supply voltage ranges that cause the circuit to consume less power and/or to operate faster than when the circuit is aged. Consequently, operating a margined circuit requires an increase in power supply voltage. Alternatively, if a higher power supply voltage is not provided, then the circuit operates at a lower clock frequency, which causes the speed of operation of the circuit to decrease.

As the foregoing illustrates, what is needed in the art is a technique for adaptively monitoring and/or adjusting for the effects of transistor aging in circuits.

SUMMARY OF THE INVENTION

One embodiment of the present invention sets for a method for monitoring the aging of a circuit. The method includes operating an aging unit included in the circuit beginning at a first time. The method also includes in response to a trigger event, operating a non-aging unit also included in the circuit beginning at a second time wherein the second time is subsequent to the first time. The method further includes detecting a frequency difference between a first frequency generated by the aging unit and a second frequency generated by the non-aging unit. The method also includes generating a modified power supply voltage based on the frequency difference. The method also includes applying the modified power supply voltage to the non-aging unit.

Other embodiments include, without limitation, a circuit for monitoring the aging of a circuit. The circuit includes an aging unit, coupled to a first power gate that is configured to selectively provide power to the aging unit. The circuit also includes a non-aging unit, coupled to a second power gate that is configured to selectively provide power to the non-aging unit. The circuit also includes a monitor controller, coupled to the first power gate and coupled to the second power gate, wherein the monitor controller is configured to provide power to the aging unit, and in response to a trigger, to provide power to the non-aging unit. The circuit also includes a frequency difference monitor, configured to detect a frequency difference between the first frequency and the second frequency. The circuit also includes a voltage offset unit, configured to apply a modified power supply voltage to the non-aging circuit.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details.

Figure 1:
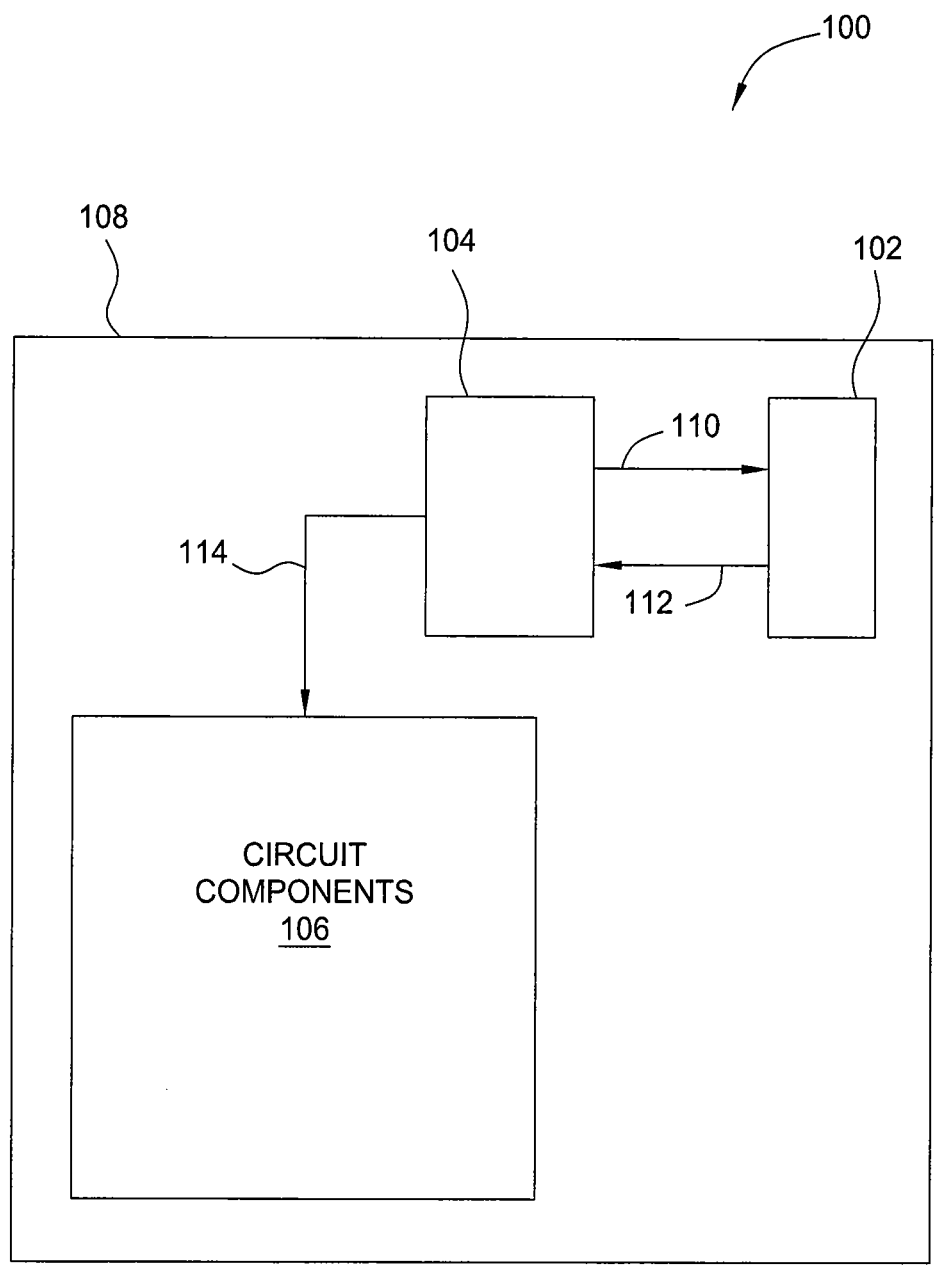
FIG. 1 illustrates a circuit configured to implement one or more aspects of the present invention.

FIG. 1 illustrates a circuit configured to implement one or more aspects of the present invention. As shown, the circuit includes a circuit enclosure 108 that includes circuit components 106, an aging monitor 102, and an aging monitor controller 104.

The circuit components 106 within the circuit 100 depicted in FIG. 1 represent a "subject circuit" that is to be monitored by the aging monitor 102, and can be any of a wide variety of well-known circuits.

Generally speaking, in a circuit, such as circuit components 106, transistors are operated by adjusting the gate voltage on the transistor from a low voltage to a high voltage or from a high voltage to a low voltage. This change in gate voltage serves to turn the transistor "off" or "on," depending on the type of the transistor (for example, an N-type metal-oxide-semiconductor (NMOS), or a P-type metal-oxide-semiconductor (PMOS)), and the direction of the change in gate voltage (for example, high-to-low, or low-to-high). A transistor is generally considered to be "on" if the transistor is passing a significant amount of current, and is generally considered to be "off" if the transistor is not passing a significant amount of current. The act of causing a transistor to change from being "on" to being "off" is referred to herein as "switching the transistor."

Over time, the effects of operating a transistor, including switching the transistor, or simply applying enough voltage across a transistor, causes the transistor to age. Aging causes the performance of a transistor to degrade. More specifically, transistors that have aged switch at a slower speed than transistors that have not aged. The cause of this reduced switching speed is that the effects of aging generally cause a parameter known as the threshold voltage (Vt) of a transistor to increase. The threshold voltage is the gate voltage at which a transistor begins passing a significant amount of current between the source and the drain of the transistor. When the threshold voltage of a transistor increases, the transistor switches less quickly. This is because more time is required for the gate voltage to reach a higher threshold voltage than a lower threshold voltage. Consequently, more time is required before the transistor is "turned on."

Figure 2:
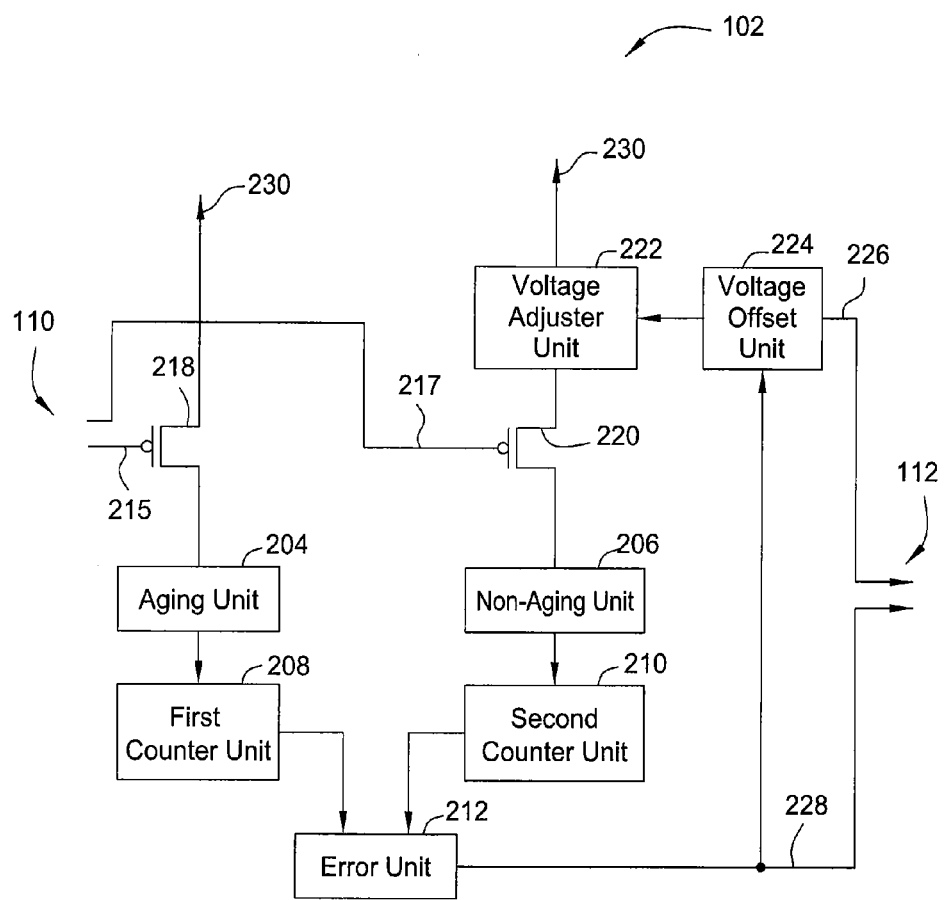
FIG. 2 illustrates an aging monitor, according to one embodiment of the present invention.

The aging monitor 102 includes components that implement an age monitoring functionality, as is described in more detail with respect to FIG. 2. The aging monitor controller 104 includes components that are configured to transmit signals to the aging monitor 102 to cause the aging monitor 102 to measure an amount of aging in the circuit components 106. The aging monitor controller 104 may cause the aging monitor 102 to measure aging in response to a trigger. For example, the monitor controller may activate the aging monitor 102 periodically, or may respond to an instruction from software executing on a computer system. The aging monitor controller 104 also includes components that are configured to receive signals from the aging monitor 102 regarding measurements taken by the aging monitor 102.

As described in more detail below, aging monitor 102 estimates the effects of aging of the transistors in circuit components 106. Aging monitor controller 104 sends signals through aging monitor input 110 to aging monitor 102 for the purpose of controlling aging monitor 102. Aging monitor 102 sends signals through aging monitor output 112 to aging monitor 102. These signals include information about measurements taken by aging monitor 102. Aging monitor controller 104 sends control signals through control signal line 114 to circuit components 106 in response to information sent from aging monitor 102. For example, aging monitor controller 104 may adjust the clock frequency for circuit components 106 or may adjust the power supply voltage for circuit components 106 in response to information sent from aging monitor 102, as described in more detail below.

FIG. 2 illustrates an aging monitor 102, according to one embodiment of the present invention. As shown, the aging monitor 102 includes an aging unit 204, a non-aging unit 206, a first power gate unit 218, a second power gate unit 220, a first counter unit 208, a second counter unit 210, an error unit 212, a voltage adjuster unit 222, and a voltage offset unit 224.

The first power gate unit 218 is coupled to a power supply rail 230 (Vdd), and to the aging unit 204. The aging unit 204 is coupled to the first counter unit 208. The first counter unit 208 is coupled to the error unit 212. A voltage adjuster unit 222 is coupled to the power supply rail 230 and to the second power gate unit 220. The second power gate unit 220 is coupled to the non-aging unit 206. The non-aging unit 206 is coupled to the second counter unit 210, which is also coupled to the error unit 212. The error unit 212 is coupled to the voltage offset unit 224, and to the aging monitor controller 104 through error unit output 228. The error unit 212 is also coupled to the voltage offset unit 224. The voltage offset unit 224 is coupled to the voltage adjuster unit 222 and to the aging monitor controller 104 through voltage offset unit output 226.

The aging unit 204 is a circuit that includes transistors. When operated, the transistors in the aging unit 204 undergo aging in a similar manner as the transistors within the circuit components 106 in the circuit 100. The non-aging unit 206 is also a circuit that includes transistors. However, the difference between the aging unit 204 and the non-aging unit 206 is that the aging monitor controller 104 is configured to provide power to the aging unit 204 while the circuit components 106 are operating, but to provide power to the non-aging unit 206 only when the aging monitor controller 104 decides to measure the aging of the circuit 100.

Because the aging unit 204 is powered when the circuit components 106 are operating, the aging unit 204 experiences an amount of aging that is comparable to the aging that the transistors within the circuit components 106 experience. On the other hand, because the non-aging unit 206 is only powered when the aging monitor controller 104 decides to measure aging, the non-aging unit 206 experiences little aging. The aging unit 204 thus serves to provide an estimate of aging for the transistors in the circuit components 106, while the non-aging unit 206 serves as a "control" against which to compare measurements obtained from the aging unit 204.

In one embodiment, the aging unit 204 and the non-aging unit 206 are both ring oscillators. As is known, a ring oscillator generally includes one or more inverters, where the output of a final inverter in the ring oscillator is coupled to the input of an initial inverter in the ring oscillator, to form a loop configuration. This loop configuration causes a voltage node associated with the ring oscillator to switch from a high voltage to a low voltage. When powered, transistors within a ring oscillator experience aging effects, just as the transistors in the circuit components 106.

A ring oscillator may be de-coupled from a power supply to cause the ring oscillator to stop operating. More specifically, when the ring oscillator is de-coupled from the power supply, current does not flow through the transistors in the ring oscillator. This, in turn, causes the ring oscillator to stop switching a voltage node in the ring oscillator. Additionally, because the transistors in a ring oscillator that is de-coupled from a power supply do not have significant voltage across their terminals, the transistors in a ring oscillator that is de-coupled from a power supply do not age. A ring oscillator can thus be caused to either experience aging effects, or to not experience aging effects, by powering or de-powering the ring oscillator.

Within the aging monitor 102, a first power gate unit 218 and a second power gate unit 220 selectively provide power to the aging unit 204 and the non-aging unit 206, respectively. The first power gate unit 218 accepts a first power gate signal 215 from the aging monitor controller 104. If the first power gate signal 215 indicates that the aging unit 204 should be unpowered, then the first power gate unit 218 does not provide power to the aging unit 204. If the first power gate signal 215 indicates that the aging unit 204 should be on, then the first power gate unit 218 provides power to the aging unit 204. Similarly, the second power gate unit 220 accepts a second power gate signal 217 from the aging monitor controller 104. If the second power gate signal 217 indicates that the non-aging unit 206 should be off, then the second power gate unit 220 does not provide power to the non-aging unit 206. If the second power gate signal 217 indicates that the non-aging unit 206 should be on, then the second power gate unit 220 provides power to the non-aging unit 206. In one embodiment, both the first power gate unit 218 and the second power gate unit 220 are transistors. In such an embodiment, the first power gate signal 215 and the second power gate signal 217 are coupled to the gates of the transistors in the first power gate unit 218 and the second power gate unit 220.

When powered, the aging unit 204 and the non-aging unit 206 both provide an output that is a series of pulses to the first counter unit 208 and the second counter unit 210, respectively. The number of pulses output by the aging unit 204 and the non-aging unit 206 within any period of time is determined by the switching speed of the transistors within the aging unit 204 and the non-aging unit 206. Because switching speed decreases as transistors age, the aging unit 204 outputs a smaller number of pulses in a given unit of time than the non-aging unit 206.

The first counter unit 208 and the second counter unit 210 receive the pulses from the aging unit 204 and the non-aging unit 206, respectively. The first counter unit 208 and the second counter unit 210 count the number of pulses that they receive, and transmit these counts to the error unit 212.

The error unit 212 determines a difference between the count in the first counter unit 208 and the count in the second counter unit 210 and transmits this difference to the voltage offset unit 224 in error unit output 228. The voltage offset unit 224 and error unit 212 function together to generate a feedback mechanism to determine a modified power supply voltage to apply to the non-aging unit 206 to cause the difference between the frequency generated by the non-aging unit 206 and the frequency generated by the aging unit 204 to be substantially zero.

More specifically, if the frequency difference is not substantially zero, then the voltage offset unit 224 determines a modified power supply voltage to apply to the non-aging unit 206. The voltage offset unit 224 causes the voltage adjuster unit 222 to adjust the power supply voltage that is applied to the non-aging unit 206 based on the modified power supply voltage. The voltage adjuster unit 222 may be a voltage divider, as is known. After the voltage adjuster unit 222 adjusts the power supply voltage that is applied to the non-aging unit 206, the error unit 212 detects a new frequency difference between the frequency generated by the aging unit 204 and the non-aging unit 206. The voltage offset unit 224 receives this frequency difference, and determines a new modified power supply voltage to apply to the non-aging unit 206. This process of measurement and adjustment repeats until the frequency difference between the aging unit 204 and the non-aging unit 206 is substantially zero.

When the frequency difference is zero, the aging monitor 102 has determined a power supply voltage offset that causes the transistors within the aging unit 204 and the non-aging unit 206 to have a substantially similar switching frequency. The voltage offset unit 224 transmits the modified power supply voltage that causes the aging unit 204 and the non-aging unit to have a substantially similar frequency to the aging monitor controller 104 through voltage offset unit output 226, which is included in aging monitor output 112. The aging monitor controller 104 subsequently determines an action to take based on the modified power supply voltage.

An example of the feedback mechanism described above with respect to FIG. 2 is described below with respect to FIG. 3.

Figure 3:
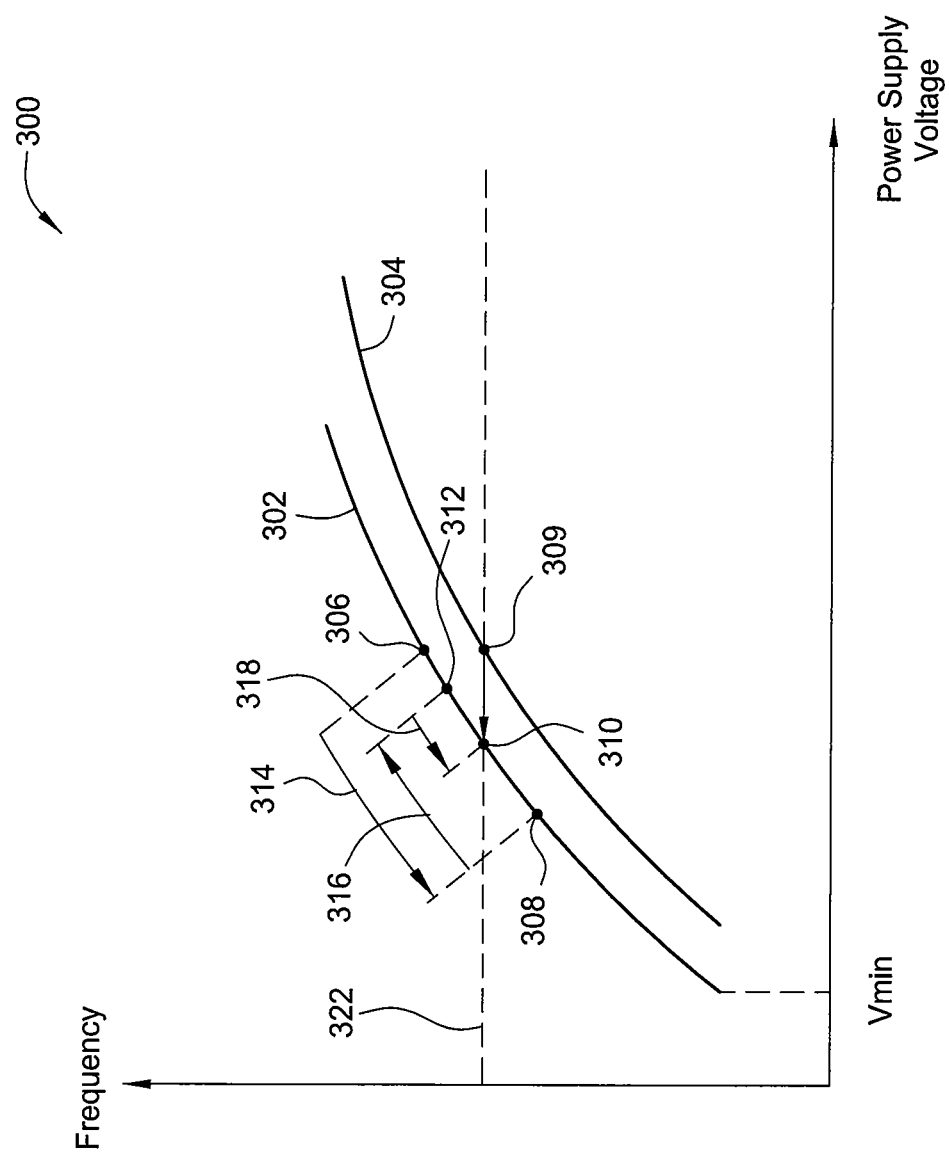
FIG. 3 is a graph of ring oscillator frequency versus power supply voltage, according to one embodiment of the present invention.

FIG. 3 is a graph 300 of ring oscillator frequency versus power supply voltage, according to one embodiment of the present invention. The graph 300 includes a first plot 302, associated with the non-aging unit 206, and a second plot 304, associated with the aging unit 204.

The first plot 302 depicts the manner in which altering the power supply voltage that is applied to the non-aging unit 206 changes the frequency with which the transistors in the non-aging unit 206 switch. As the power supply voltage increases, the frequency increases, and vice versa. Similarly, the second plot 304 depicts the manner in which altering the power supply voltage that is applied to the aging unit 204 changes the frequency with which the transistors in the aging unit 204 switch. The second plot 304 is shifted to the right from the first plot. This indicates that because the aging unit 204 has experienced some aging, to achieve the same frequency of switching, the non-aging unit 206 is provided with a lower power supply voltage than the aging unit 204.

Initially, that is, before the aging monitor 102 begins to make a measurement of aging, the power supply voltage applied to the aging unit 204 is the same as the power supply voltage applied to the non-aging unit 206. This is shown in that the first plot point 306 on the first plot 302 is vertically aligned with, and thus at the same power supply voltage as the plot point 309 on the second plot 304.

To begin monitoring, the aging monitor controller 104 causes the second power gate unit 220 to transmit current from the voltage adjuster unit 222 to the non-aging unit 206. Because the non-aging unit 206 is powered, the non-aging unit 206 transmits pulses to the second counter unit 210. The second counter unit 210 counts the pulses sent by the non-aging unit 206. The first counter unit 208 also counts the pulses sent by the aging unit 204, which is also powered.

The error unit 212 computes the difference between the number of pulses from the aging unit 204 and the number of pulses from the non-aging unit 206, and provides this difference to the voltage offset unit 224. Based on this difference, the voltage offset unit 224 determines that a first voltage adjustment should be made to the power supply voltage for the non-aging unit 206, and causes the voltage adjuster unit 222 to apply the determined voltage adjustment to the non-aging unit 206.

The determined voltage adjustment is represented by transition 314, from plot point 306 to plot point 308. According to transition 314, the voltage adjustment downward causes the frequency of the non-aging unit 206 to shift downward as well. However, as can be seen from the graph, the frequency of the non-aging unit 206 is now below the frequency of the aging unit 204, causing a new frequency difference. This frequency difference is detected in error unit 212, which provides the frequency difference to the voltage offset unit 224. The voltage offset unit 224 determines that another adjustment should be made to the Vdd that is applied to the non-aging unit 206, and does so. This second Vdd adjustment is represented by transition 316, from plot point 308 to plot point 312. After this second transition 316, the voltage increases again. The frequency is now higher than the frequency of the aging unit 204. Therefore, the voltage offset unit 224 determines that another adjustment should be made, which is represented by transition 318, from plot point 312 to plot point 310. After this third transition 318, the frequency of the non-aging unit 206 is substantially the same as the frequency of the aging unit 204, as can be seen by iso-frequency line 322.

The information determined by this feedback mechanism represents how much the power supply voltage of a non-aged transistor should be adjusted in order to cause the non-aged transistor to have a similar switching frequency to a transistor that has generally experienced a similar amount of aging as transistors in the circuit components 106. This information is related to the amount of aging experienced by the transistors in the circuit components 106. However, a more useful characteristic to estimate is the threshold voltage of transistors within the circuit components 106. As explained above, the threshold voltage is the voltage at which a transistor "switches," and thus is a good indicator of the age of a transistors.

Figure 4:
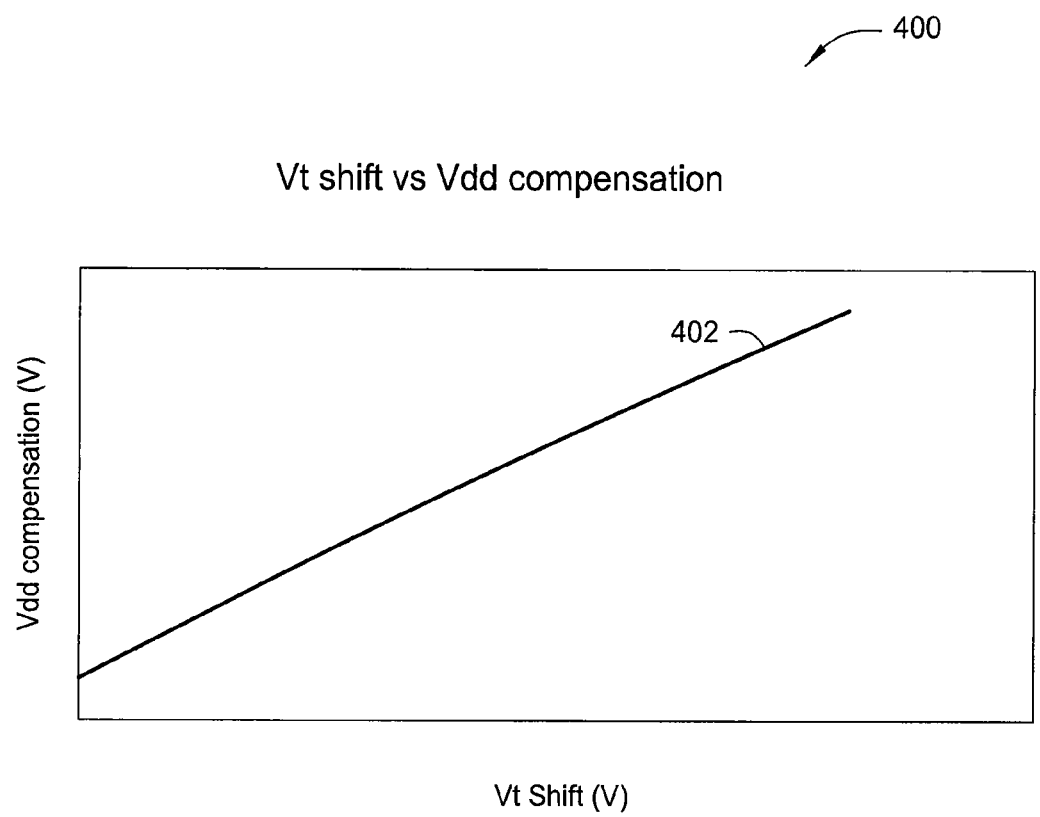
FIG. 4 illustrates a graph of voltage offset versus threshold voltage shift, according to one embodiment of the present invention.

To determine the threshold voltage of the transistors within the circuit components 106 from the power supply voltage offset determined by the aging monitor 102, the aging monitor controller 104 (e.g., through a threshold voltage estimator within the aging monitor 104) consults stored data that relates a power supply voltage offset to a threshold voltage, such as the data represented by the graph 400 depicted in FIG. 4.

FIG. 4 illustrates a graph 400 of voltage offset versus threshold voltage shift, according to one embodiment of the present invention. As shown, the graph includes a plot 402 of power supply voltage shift versus threshold voltage shift. As can be seen, as power supply voltage compensation increases, the threshold voltage shift increases. This illustrates that as the non-aging unit 206 requires more compensation to match frequencies to the aging unit 204, more aging occurs, and thus a greater shift in threshold voltage in the aging unit 204 occurs.

Once threshold voltage shift is determined, the aging monitor controller 104 determines what action to take in order to compensate for the aging of the transistors in the circuit components 106. One way to compensate for this aging is to adjust the clock frequency for the circuit components 106 lower. By adjusting the clock frequency lower, the transistor has a greater amount of time during a cycle in which to switch, since the clock cycle lasts for a longer amount of time.

One other way to compensate for transistor aging is to increase the power supply voltage. By increasing the power supply voltage, the difference in voltage between the source and the drain of the transistors in the circuit components 106 increases. This, in turn, causes the transistor to pass more current for the same gate voltage which allows transistors in the circuit components 106 to signal more quickly, by reaching voltages more quickly.

Figure 5:
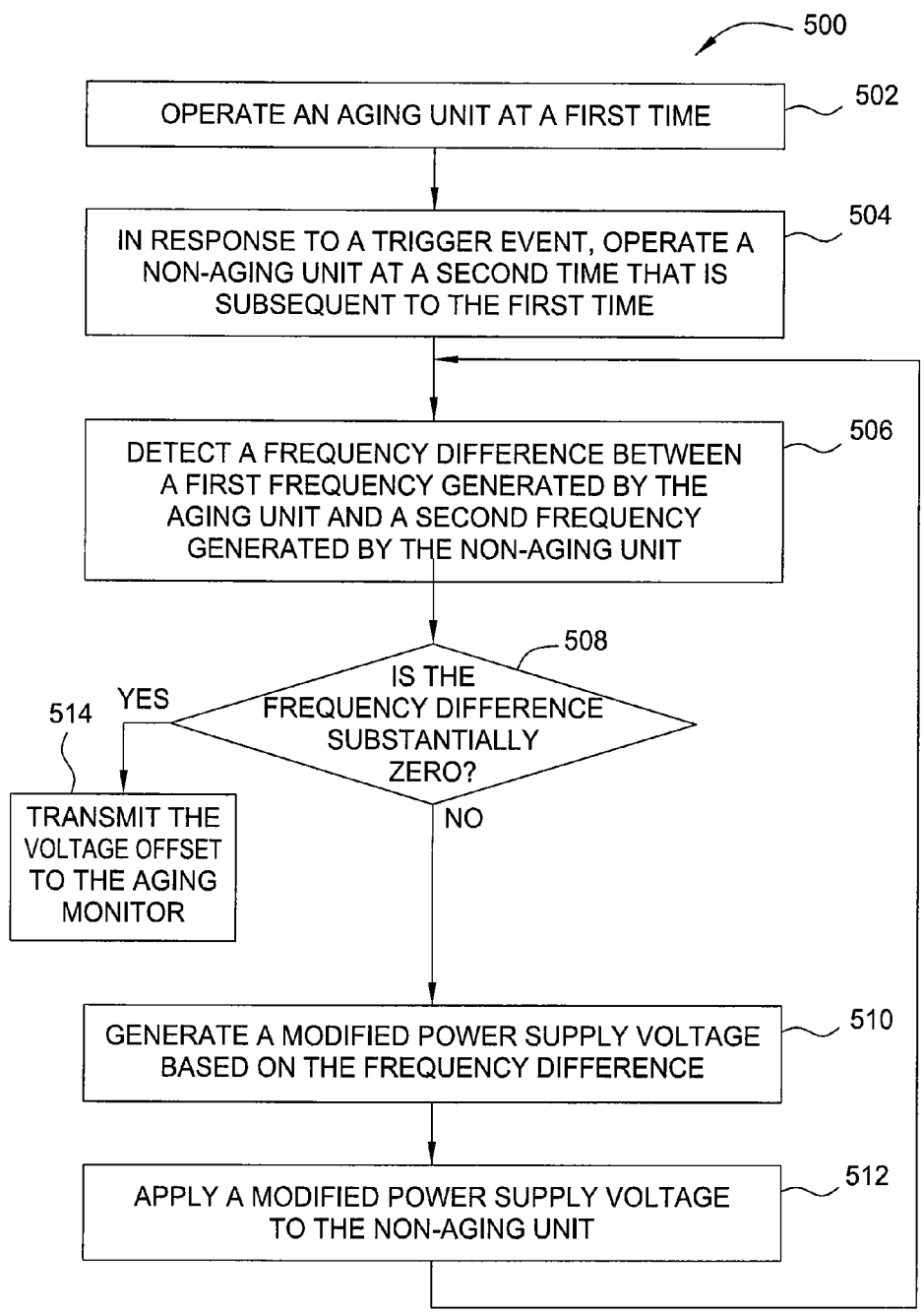
FIG. 5 is a flow diagram of method steps for determining a power supply voltage offset, according to one embodiment of the present invention.

FIG. 5 is a flow diagram of method steps for determining a power supply voltage offset, according to one embodiment of the present invention. Although the method steps are described in conjunction with FIGS. 1-4, persons skilled in the art will understand that any system configured to perform the method steps, in any order, falls within the scope of the present invention.

As shown, a method 500 begins at step 502, where the aging monitor controller 104 operates an aging unit 204 at a first time. At step 504, in response to a trigger event, the aging monitor controller 104 operates a non-aging unit 206 at a second time that is subsequent to the first time. At step 506, an error unit 212 detects a frequency difference between a first frequency generated by the aging unit 204 and a second frequency generated by the non-aging unit 206. At step 508, the aging monitor 102 detects whether the frequency difference is substantially zero. If the frequency difference is not substantially zero, then the method proceeds to step 510, in which a voltage adjuster unit 222 generates a modified power supply voltage. In step 512, the voltage adjuster unit 222 applies the modified power supply voltage to the non-aging unit 206. The method then loops back to step 506.

If, after step 508, the frequency difference is substantially zero, then the method proceeds to step 514. In step 514, the voltage offset unit 224 transmits the voltage offset to the aging monitor controller 104.

In sum, an aging monitor is provided for monitoring the aging effects in a circuit. The aging monitor includes an aging component and a non-aging component. A monitor controller ages the aging component by continuously switching the aging component. The monitor controller switches the non-aging component infrequently, for example, only when the monitor controller measures the amount of aging for the aging component. The monitor controller monitor measures the differences in switching frequency between the aging component and non-aging component. The monitor controller applies a power supply voltage compensation to the non-aging component until the non-aging component has substantially similar switching frequency as the aging component. Subsequently, a threshold voltage calculator calculates a threshold voltage shift for the aging component based on the power supply voltage compensation.

Based on the threshold voltage shift for the aging component, software calculates a Vdd operating range for the circuit, where the Vdd operating range indicates a minimum Vdd for circuit functionality, and a range of Vdd values that may be applied to the circuit, as well as a relationship between a clock frequency and the Vdd level that generates that clock frequency. Based on the Vdd operating range, a circuit controller adjusts the clock speed and/or Vdd to compensate for the effects of aging, based on the Vdd operating range.

By comparing switching frequencies between an aging unit and a non-aging unit, the amount of aging experienced by a circuit is monitored in a real-time manner. This real-time manner allows for the adjustment for aging effects as the aging effects actually occur. Advantageously, a circuit that includes the aging monitor does not need to be "margined." Thus, the circuit is operated with advantageous parameters when the circuit is new. More specifically, the circuit can be operated with a lower power supply voltage, thus reducing power consumption as compared with a margined circuit. Alternatively, the circuit can be operated at a higher clock frequency for the same power supply voltage, thus increasing operating speed.

As is generally understood by those of skill in the art, the terms "high" or "high voltage" and "low" or "low voltages" as used herein refer to voltages that are near a power supply voltage or a ground voltage, respectively. Further, a high voltage generally represents a logical "1", and a low voltage generally represents a logical "0." During operation, various nodes in a 6T SRAM cell may have intermediate voltages between the high and low voltages, but due to the bi-stable nature of the 6T SRAM cell, these intermediate voltages eventually "settle" to "final values," such as the high voltage or low voltage described above.

The invention has been described above with reference to specific embodiments. Persons of ordinary skill in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

Therefore, the scope of embodiments of the present invention is set forth in the claims that follow.

What is claimed is:

1. A method for compensating for aging in a circuit, the method comprising:

operating an aging unit included in the circuit beginning at a first time;
in response to a trigger event, operating a non-aging unit also included in the circuit beginning at a second time wherein the second time is subsequent to the first time;
wherein the aging unit is a first circuit that includes transistors and the non-aging unit is a second circuit that includes transistors;
detecting a frequency difference between a first frequency generated by the aging unit and a second frequency generated by the non-aging unit;
generating a modified power supply voltage based on the frequency difference;
applying the modified power supply voltage to the non-aging unit; and
estimating a shift in a threshold voltage for a transistor in the circuit based on the modified power supply voltage applied when the frequency difference is substantially zero.

2. The method of claim 1, wherein operating the aging unit comprises causing a first internal voltage node included in the aging unit to switch from a high voltage to a low voltage one or more times, and wherein operating the non-aging unit comprises causing a second internal voltage node included in the non-aging unit to switch from the high voltage to the low voltage one or more times.

3. The method of claim 2, wherein detecting the frequency difference comprises accumulating a first count of the number of times that the first internal voltage node switches from a high voltage to a low voltage, and accumulating a second count of the number of times that the second internal voltage node switches from a high voltage to a low voltage.

4. The method of claim 3, wherein detecting the frequency difference further comprises accumulating an error value based on a difference between the first count and the second count.

5. The method of claim 1, further comprising repeating the steps of detecting, generating, and applying until the frequency difference is substantially zero.

6. The method of claim 1, wherein the modified power supply voltage comprises a voltage that is less than or substantially equal to a power supply voltage applied to the circuit.

7. The method of claim 6, wherein the modified power supply voltage is never adjusted above the power supply voltage applied to the circuit.

8. The method of claim 7, wherein estimating the shift in the threshold voltage further comprises determining the shift in the threshold voltage based on empirical data that relates modified power supply voltage to threshold voltage shift.

9. The method of claim 8, further comprising periodically operating the non-aging unit.

10. A circuit aging monitor, comprising:
an aging unit, coupled to a first power gate that is configured to selectively provide power to the aging unit, wherein the aging unit is configured to switch a first internal voltage node at a first frequency when the first power gate provides power to the aging unit, and to not switch the first internal voltage node when the first power gate does not provide power to the aging unit;
a non-aging unit, coupled to a second power gate that is configured to selectively provide power to the non-aging unit, wherein the non-aging unit is configured to switch a second internal voltage node at a second frequency when the second power gate provides power to the non-aging unit, and to not switch the second internal voltage node when the second power gate does not provide power to the non-aging unit;
wherein the aging unit is a first circuit that includes transistors and the non-aging unit is a second circuit that includes transistors;
a monitor controller, coupled to the first power gate and coupled to the second power gate, wherein the monitor controller is configured to provide power to the aging unit, and in response to a trigger, to provide power to the non-aging unit;
a frequency difference monitor, configured to detect a frequency difference between the first frequency and the second frequency;
a voltage offset unit, configured to apply a modified power supply voltage to the non-aging circuit, based on the frequency difference, and to adjust the modified power supply voltage until the frequency difference is substantially zero; and
a threshold voltage estimator, configured to estimate a shift in a threshold voltage for a transistor in the circuit based on the modified power supply voltage applied when the frequency difference is substantially zero.

11. The circuit aging monitor of claim 10, wherein the aging unit comprises a first ring oscillator, and wherein the non-aging unit comprises a second ring oscillator.

12. The circuit aging monitor of claim 11, further comprising:
a first counter configured to accumulate a first count of the number of times that the first internal voltage node switches; and
a second counter configured to accumulate a second count of the number of times that the second internal voltage node switches.

13. The circuit aging monitor of claim 12, wherein the frequency difference monitor includes an error accumulator configured to accumulate an error that is a difference between the first count and the second count.

14. The circuit aging monitor of claim 13, wherein the monitor controller is coupled to the error accumulator and is further configured to receive the error from the error accumulator.

15. The circuit aging monitor of claim 14, wherein the voltage offset unit comprises a voltage divider that is configured to modify a power supply voltage by an amount that is based on the frequency difference, to generate a modified power supply voltage, and to transmit the modified power supply voltage to the non-aging unit.

16. The circuit aging monitor of claim 15, wherein the first ring oscillator comprises an odd number of inverters arranged in a loop, and wherein the second ring oscillator comprises an odd number of inverters arranged in a loop.

17. The circuit aging monitor of claim 16, wherein the first power gate is a first power gate transistor having a gate, and wherein the second power gate is a second power gate transistor having a gate.

18. A circuit comprising:
an aging monitor comprising:
an aging unit, coupled to a first power gate that is configured to selectively provide power to the aging unit, wherein the aging unit is configured to switch a first internal voltage node at a first frequency when the first power gate provides power to the aging unit, and to not switch the first internal voltage node when the first power gate does not provide power to the aging unit;
a non-aging unit, coupled to a second power gate that is configured to selectively provide power to the non-aging unit, wherein the non-aging unit is configured to switch a second internal voltage node at a second frequency when the second power gate provides power to the non-aging unit, and to not switch the second internal voltage node when the second power gate does not provide power to the non-aging unit;

wherein the aging unit is a first circuit that includes transistors and the non-aging unit is a second circuit that includes transistors;

a monitor controller, coupled to the first power gate and coupled to the second power gate, wherein the monitor controller is configured to provide power to the aging unit, and in response to a trigger, to provide power to the non-aging unit;

a frequency difference monitor, configured to detect a frequency difference between the first frequency and the second frequency;

a voltage offset unit, configured to apply a modified power supply voltage to the non-aging circuit, based on the frequency difference, and to adjust the modified power supply voltage until the frequency difference is substantially zero, and a threshold voltage estimator, configured to estimate a shift in a threshold voltage for a transistor in the circuit based on the modified power supply voltage applied when the frequency difference is substantially zero;

a plurality of circuit elements; and a controller configured to alter the power supply voltage provided to the plurality of circuit elements based on the frequency difference.

19. The circuit aging monitor of claim 18, wherein the aging unit comprises a first ring oscillator, and wherein the non-aging unit comprises a second ring oscillator.

20. The circuit aging monitor of claim 19, wherein the aging monitor further comprises a first counter configured to accumulate a first count of the number of times that the first internal voltage node switches; and a second counter configured to accumulate a second count of the number of times that the second internal voltage node switches.

* * * * *